United States Patent [19]

Bruno et al.

[11] Patent Number: 5,057,772
[45] Date of Patent: Oct. 15, 1991

[54] METHOD AND SYSTEM FOR CONCURRENT ELECTRONIC COMPONENT TESTING AND LEAD VERIFICATION

[75] Inventors: David A. Bruno; John T. Gross, both of San Diego, Calif.

[73] Assignee: Electro Scientific Industries, Inc., Portland, Oreg.

[21] Appl. No.: 531,077

[22] Filed: May 29, 1990

[51] Int. Cl.$^5$ .............................................. G01R 27/04
[52] U.S. Cl. .............................. 324/158 P; 324/72.5; 324/73.1; 324/537
[58] Field of Search ............... 324/73.1, 158 R, 158 F, 324/158 P, 72.5, 537, 500, 538; 364/551.01

[56] References Cited

U.S. PATENT DOCUMENTS

| | | | |
|---|---|---|---|
| 4,038,599 | 7/1977 | Bove et al. | 324/158 P |
| 4,175,253 | 11/1979 | Pitegoff | 324/158 P |
| 4,342,958 | 8/1982 | Russell | 324/158 P |
| 4,780,836 | 10/1988 | Miyazaki et al. | 324/158 P |
| 4,891,577 | 1/1990 | Ishikawa | 324/73.1 |
| 4,918,374 | 4/1990 | Stewart et al. | 324/73.1 |

*Primary Examiner*—Kenenth A. Wieder
*Assistant Examiner*—Vinh P. Nguyen
*Attorney, Agent, or Firm*—Stoel Rives Boley Jones & Grey

[57] ABSTRACT

A system (100) performs concurrent testing and lead verification of an electronic component (104) having two leads (126 and 128). The system includes circuitry (114 and 116) for determining a sum of amounts of contact resistances between first (132) and second (134) probes and one of the leads by producing a current ($I_1$) that propagates through the first probe, the lead of the component, and the second probe. The sum of the contact resistances is proportional to the difference in voltage between the leads. If the difference exceeds a limit, then the sum of the amount of contact resistances is excessive. The system also includes circuitry (110) for determining a value of a parameter of the component while the sum of the amounts of contact resistances is being determined. The circuit for determining the sum of the contract resistances and the circuitry for determining the value of the parameter are electrically isolated from each other so that they do not influence each other.

22 Claims, 7 Drawing Sheets

METHOD AND SYSTEM FOR CONCURRENT ELECTRONIC COMPONENT TESTING AND LEAD VERIFICATION

FIELD OF THE INVENTION

The present invention relates to a method and system for performing a component test and lead verification of the test instrument that performs the component test and, in particular, to a method and a system that performs a component test and lead verification concurrently.

BACKGROUND OF THE INVENTION

Electronic components such as resistors, capacitors, and inductors are typically tested in a high speed handler. Testing the components includes two steps: (1) performing lead verification to determine whether the contact resistance between the leads of the component and test probes is within an acceptable range, and (2) performing component tests to measure certain parameters such as capacitance, dissipation factor, inductance, and resistance. Contact resistance is due to, for example, oxidization on the component leads. Kelvin 4-terminal testers are commonly used for performing component testing but eliminate the lead and contact impedances from the measurement only to a particular magnitude.

Figure 1:
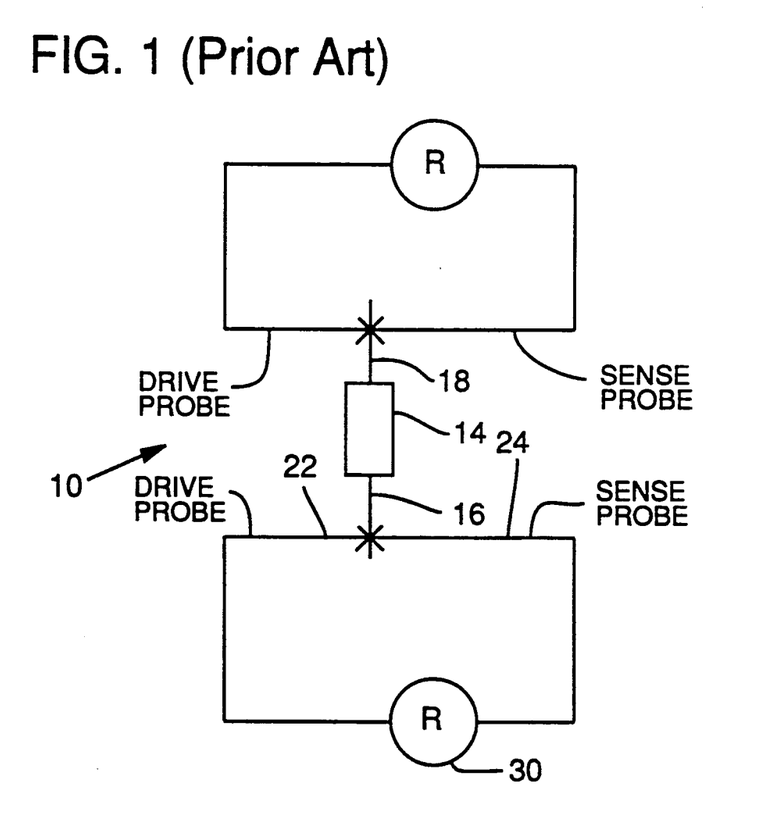
FIG. 1 shows a prior art system for performing lead verification.

FIG. 1 shows a prior art circuit 10 which employs two 2-terminal testers for lead verification. A device under test ("DUT") component 14 includes bottom lead 16 and top lead 18. A low impedance drive (or excitation) probe 22 and a low impedance sense probe 24 are connected to opposite sides of lead 16. Probes 16 and 22 are also connected to a resistance meter 30. The total resistance in the lower loop of circuit 10 includes the resistance in lead 16, which is typically negligible, the resistance of the contact between drive probe 22 and lead 16, and the resistance of the contact between sense probe 24 and lead 16. The total resistance also includes the resistance in probes 22 and 24, and the resistance in the resistance meter 30. The total resistance in the entire lower loop may be determined with resistance meter 30. An identical measurement is performed to the upper circuit.

The resistance in probes 22 and 24 and resistance meter 30 can be known. The resistance in lead 16 is typically very small or negligible. By subtracting the known resistances from the total resistance, the resistance of the two contacts can be determined. If the resistance of the two contacts is above a maximum, for example, 100 milliohms, then the component test will not be reliable.

Figure 2:
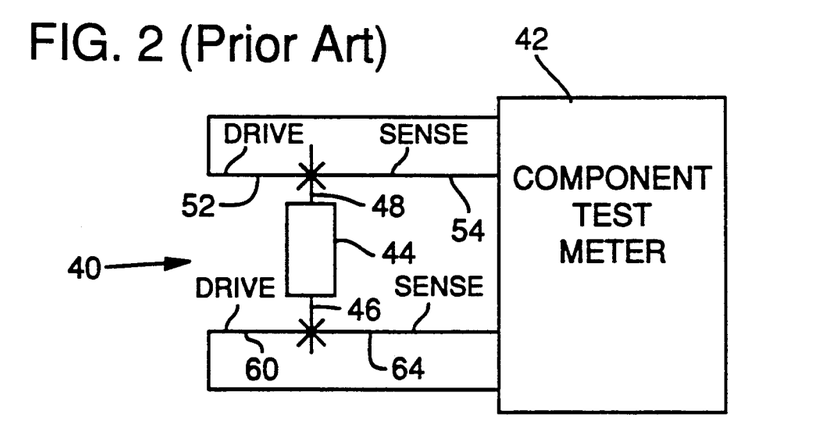
FIG. 2 shows a prior art system for performing component testing.

FIG. 2 shows a prior art circuit 40 that employs a Kelvin 4-terminal tester for testing components for parameters such as resistance and capacitance. Low impedance drive probe 52 and very high impedance sense probe 54 are connected to opposite sides of the lead 48. A current is sent through drive probe 52 from component test meter 42. Virtually all of the current from drive probe 52 goes through component 44 to lower drive probe 60. The current returns to component test meter 42 through drive probe 60, which is positioned on the opposite side of lead 46 from high impedance sense probe 64. Sense probes 54 and 64 sense the voltage across component 44.

Heretofore, lead verification has been performed as a separate test from component parameter tests. Performing the tests separately causes two problems. First, although the leads are verified before and/or after the component test, the contact resistance between the probes and the lead may change after the contact resistance is measured but before the completion of the testing of the component, leading to unreliable component test results. Second, the serial nature of the method increases the total time used to test the component. There is, therefore, a need to increase both the accuracy and the speed of lead verification and component testing.

SUMMARY OF THE INVENTION

It is, therefore, an object of the invention to provide a method and system for performing rapid and accurate lead verification and component testing.

It is a further object of the invention to provide a method and system that perform concurrent lead verification and component testing.

A system performs concurrent testing and lead verification of an electronic component having two leads. The system includes circuitry for determining a sum of amounts of contact resistances between first and second probes and one of the leads by producing a current that propagates through the first probe, the lead of the component, and the second probe. The sum of the contact resistances is proportional to the difference in voltage between the leads. If the difference exceeds a limit, then the sum of the amount of contact resistances is excessive. The system also includes circuitry for determining a value of a parameter of the component while the sum of the amounts of contact resistances is being determined. The circuitry for determining the sum of the contract resistances and the circuitry for determining the value of the parameter are electrically isolated from each other so that they do not influence each other.

DETAILED DESCRIPTION OF PREFERRED EMBODIMENT

Figure 3:
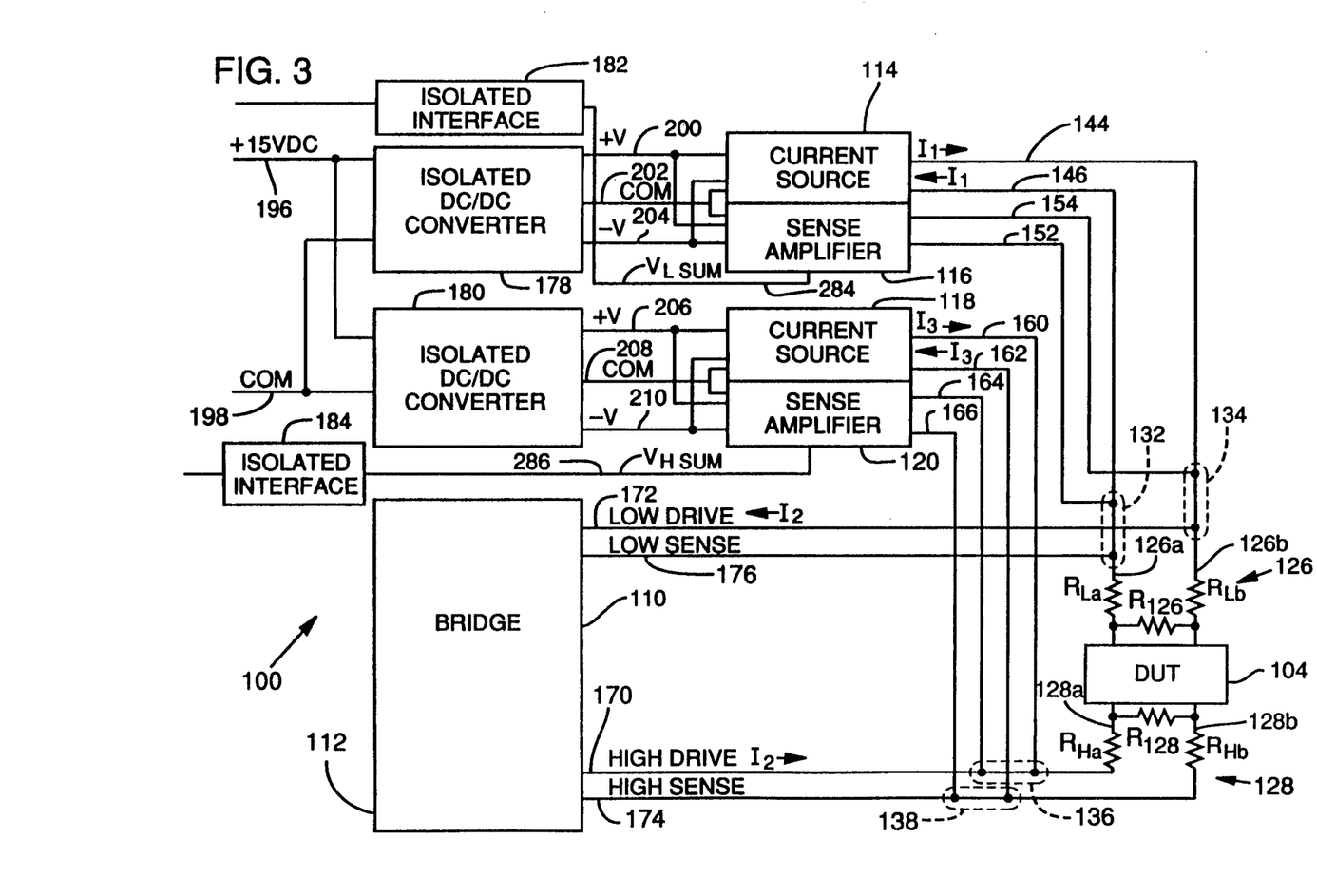
FIG. 3 shows a block diagram of the system of the present invention in which lead verification and component testing are performed concurrently.

Referring to FIG. 3, a system 100 performs concurrent lead verification and component testing of a device under test ("DUT") 104. Component testing is performed by bridge 110, which is a conventional 4-terminal LRC (inductance, resistance, and capacitance) meter, such as, for example, an ESI Model 410 LRC meter, manufactured by Electro Scientific Industries, Inc., of Portland, Oregon. Bridge 110 includes container 112, which is shown schematically as a rectangle in FIGS. 3, 8a, and 8b.

DUT 104 includes leads 126 and 128. Probes 132 and 134 are connected to opposite sides of lead 126 in a conventional manner, and probes 136 and 138 are connected to opposite sides of lead 128 in a conventional manner. Lead 126 is modeled as two conductors 126a and 126b, and lead 128 is modeled as two conductors 128a and 128b, because there is contact resistance between each point in which a probe contacts a lead. The contact resistances between probes 132 and 134 and between conductors 126a and 126b are $R_{Ls}$ and $R_{Lb}$, respectively. The symbol "L" represents "low" because lead 126 is on the electrically low voltage side of bridge 110. The contact resistance between probes 136 and 138 and conductors 128a and 128b are $R_{Ha}$ and $R_{Hb}$, respectively. The symbol "H" represents "high" because lead 128 is on the electrically high voltage side of bridge 110. Resistors $R_{126}$ and $R_{128}$ model the resistances inside and on the surface of leads 126 and 128, respectively. The resistances of $R_{126}$ and $R_{128}$ are typically very low.

Bridge 110 makes measurements of parameters of DUT 104 based on values of signals that are conducted on conductors that are connected between bridge 110 and probes 132, 134, 136, and 138. If the contacts between probes 132 and 134 and lead 126, and between probes 136 and 138 and lead 128 are not adequate, then the results of the measurements made by bridge 110 will be unreliable. Current sources 114 and 118, and sense amplifiers 116 and 120 perform lead verification to determine whether the contacts are adequate.

Lead verification of the contact between probes 132 and 134 and lead 126 is preferably performed with a 4-terminal lead verification system, such as the one which is described in connection with FIG. 3. Alternatively, a conventional two-terminal lead verification system, such as the one shown in FIG. 1, may be used. Current source 114 provides current $I_1$, which is conducted through lead 144 to probe 134. Probe 134 is in contact with lead 126. As will be explained below, virtually all of current $I_1$ travels from lead 126b through the interior or on the surface of lead 126 (modelled as resistor $R_{126}$) to lead 126a, rather than to traveling through DUT 104.

Sense amplifier 116 senses the voltage difference between probes 132 and 134, which are connected to sense amplifier 116 through leads 152 and 154, respectively. Current source 114, sense amplifier 116, leads 144, 146, 152, and 154, and probes 132 and 134 form a 4-terminal lead verification system. In the 4-terminal lead verification system, leads 152 and 154 are connected directly to probes 132 and 134, rather than to leads 144 and 146 or some other portion of a circuit as is done in FIG. 1. Therefore, sense amplifier 116 measures the voltage differences between probes 132 and 134 and not the voltage differences across leads 144 and 146, or some other portion of a circuit as is done in FIG. 1.

The sum $R_{LSUM}$ of the contact resistances $R_{La}$ and $R_{Lb}$ in lead 126 may be calculated by dividing the voltage measured by sense amplifier 116 by current $I_1$. If $R_{LSUM}$ exceeds a certain maximum value, then the testing of DUT 104 by bridge 110 cannot be performed reliably, and system 100 may retest or reject DUT 104. The resistance $R_{126}$ is usually negligible and, therefore, may be ignored or factored into determining the maximum value.

Lead verification of the contact between probes 136 and 138 and lead 128 is performed by current source 118 and sense amplifier 120 in the same manner that lead verification of the contacts between probes 132 and 134 and lead 126 is performed by current source 114 and sense amplifier 116. Current source 118 generates current $I_3$, which is conducted through lead 160, probe 136, the contact between probe 136 and lead 128 (modeled as lead 128a), lead 128 (modeled as resistor $R_{128}$), the contact between lead 128 and probe 138 (modeled as lead 128b), probe 138, and lead 162. The difference in voltage between probes 136 and 138 is measured by sense amplifier 120 through leads 164 and 166.

In the above-described preferred embodiment, system 100 provides known currents, $I_1$ and $I_3$, and measures unknown voltages in order to determine resistances $R_{La}$, $R_{Lb}$, $R_{Ha}$, and $R_{Hb}$. Alternatively, system 100 could provide known voltages and measure unknown currents to determine resistances $R_{La}$, $R_{Lb}$, $R_{Ha}$, and $R_{Hb}$.

Component testing of DUT 104 is performed by bridge 110 as follows. Bridge 110 provides a current $I_2$ through high drive lead 170. Current $I_2$ is conducted by lead 170, probe 136, lead 128, DUT 104, lead 126, probe 134, and low drive lead 172. The difference in voltage between probes 132 and 138 is measured by bridge 110 through high sense lead 174 and low sense lead 176. As noted above, bridge 110 is a conventional LRC meter that measures parameters such as inductance, resistance, capacitance, dissipation factor, and equivalent series resistance (ESR).

Regardless of the type of DUT 104 being tested, $I_1$, $I_2$, and $I_3$ are not limited to specific frequencies. Current $I_2$ has a frequency that is substantially different from the frequencies of currents $I_1$ and $I_3$. In addition, $I_1$ and $I_3$ may have substantially different frequencies. If DUT 104 is a capacitor, then preferably, currents $I_1$ and $I_3$ are each direct currents having a frequency of zero, and current $I_2$ has a substantially higher frequency, such as 1 MHz If DUT 104 is a resistor having low resistance, then some current from $I_1$ or $I_3$ may travel through DUT 104 and influence sense amplifier 120 or 116, respectively. Therefore, if DUT 104 is a resistor, then preferably, current $I_2$ is a direct current having a frequency of zero and currents $I_1$ and $I_3$ have a frequencies that are higher, such as 1 MHz. Currents $I_1$, $I_2$, and $I_3$ could each have substantially different frequencies, whether or not $I_2$ is a direct current. The use of appropriate filters would prevent currents $I_1$ and $I_3$ from influencing the measurement of bridge 110, and $I_2$ from influencing the measurement of sense amplifiers 116 and 120.

Figure 8A:
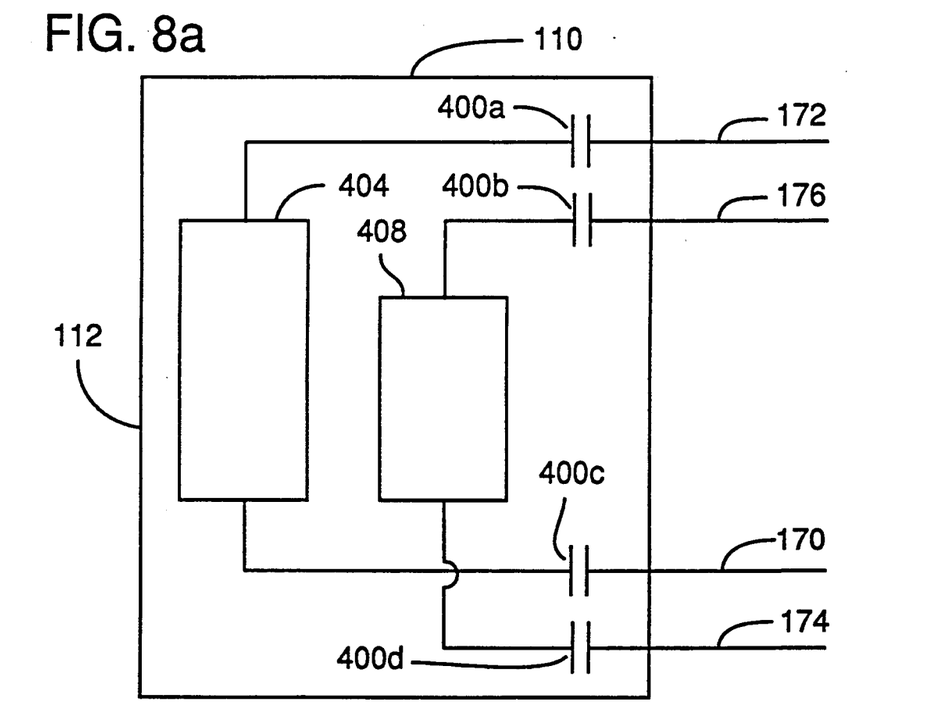
FIG. 8a shows a low-frequency blocking circuit for blocking low frequency signals from entering the bridge.

FIG. 8a shows low-frequency blocking circuits 400a, 400b, 400c, and 400d, which are each a capacitor that acts as a high pass filter. Blocking capacitors 400a, 400b, 400c, and 400d are located inside of container 112. Blocking capacitors 400a and 400c are connected between current splice 404 and leads 172 and 170, respectively. Blocking capacitors 400b and 400d are connected between sense amplifier 408 and leads 176 and 174, respectively. Sense amplifier 408 measures the difference in voltage between leads 174 and 176. FIG. 8a illustrates the case in which current $I_2$ has a substantially higher frequency than the frequencies of currents $I_1$ and $I_3$.

Figure 8B:
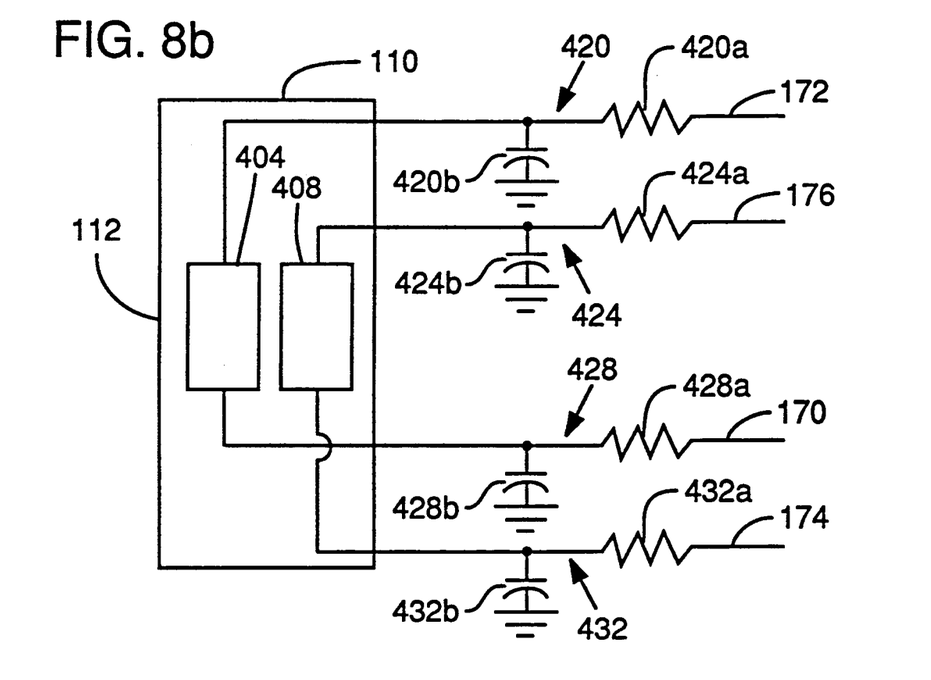
FIG. 8b shows a high-frequency blocking circuit for blocking high frequency signals from entering the bridge.

FIG. 8b shows high-frequency blocking filter circuits 420, 424, 428, and 432, which block high frequency signals on the respective leads 172, 176, 170, and 174 from entering bridge 110. Filters 420, 424, 428, and 432 are located outside of container 112. Filters 420, 424, 428, and 432 each include a resistor 420a, 424a, 428a, and 432a, and a capacitor 420b, 424b, 428b, and 432b, respectively. FIG. 8b illustrates the case in which currents $I_1$ and $I_3$ have substantially higher frequencies than the frequency of current $I_2$. One skilled in the art will appreciate that it is preferred that capacitors 400a–400d, shown in bridge 110 in FIG. 8a, not be incorporated into bridge 110 in the case where currents $I_1$ and $I_3$ have substantially higher frequencies than the frequency of current $I_2$.

Bridge 110, current source 114, sense amplifier 116, current source 118, and sense amplifier 120 are each electrically isolated from one another. Bridge 110 contains capacitors or other filters that block currents $I_1$ and $I_3$ from entering leads 170, 172, 174, and 176. If currents $I_1$ and $I_3$ have a high frequency, then bandpass filters may be placed on leads 170, 172, 174, and 176 to prevent currents $I_1$ and $I_3$ from entering leads 170, 172, 174, and 176. Current sources 114 and 118 contain filters (illustrated in FIG. 5) that prevent current $I_2$ from entering leads 144 and 146. Sense amplifiers 116 and 120 have very high input impedances to ensure that no amount or only negligible amounts of currents $I_1$ and $I_2$ flow into the inputs of amplifiers 116 and 120. Sense amplifiers 116 and 120 include filters (illustrated in FIG. 6) that prevent current $I_2$ from influencing voltage measurements by sense amplifiers 116 and 120.

In addition, the power supply (not shown) of bridge 110 is electrically isolated, except for a few picofarads of stray capacitance, from current sources 114 and 118 and sense amplifiers 116 and 120 by isolated DC/DC converters 178 and 180. The stray capacitance might allow a negligible amount of current to be exchanged between bridge 110 and current sources 114 and 118, and sense amplifiers 116 and 120. Isolated interfaces 182 and 184 electrically isolate sense amplifiers 116 and 118 from a computer (not shown), which may share a common voltage with bridge 110. Isolated interfaces 182 and 184 may use optical isolation, capacitive isolation, or another conventional form of isolation.

Figure 4A:
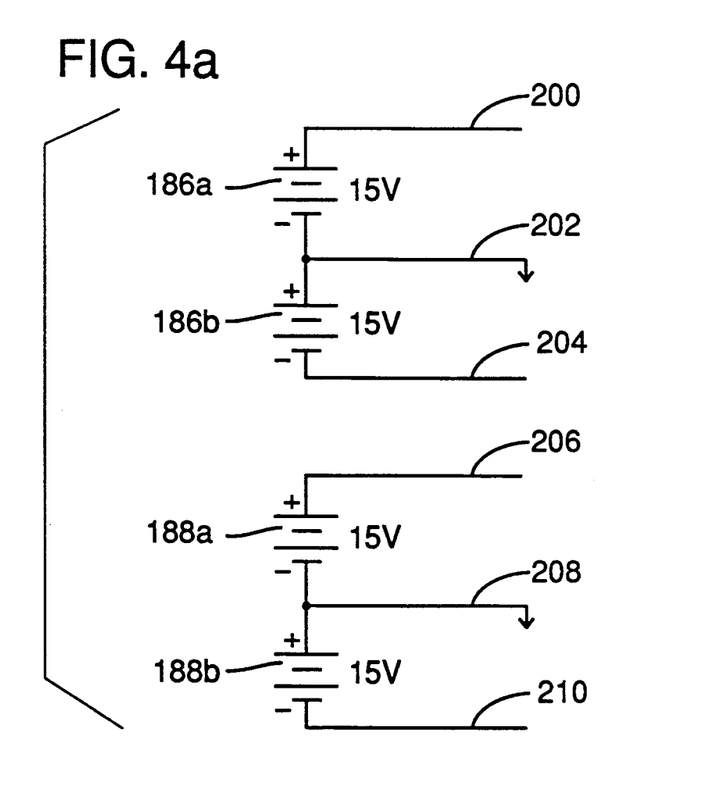
FIG. 4a shows an arrangement of batteries that electrically isolate the current sources and sense amplifiers from the bridge.

Referring to FIG. 4a, batteries 186a, 186b, 188a, and 188b, which are preferably rechargeable, may be used in place of isolated interfaces 178 and 180, and conductors 196 and 198.

Figure 4B:
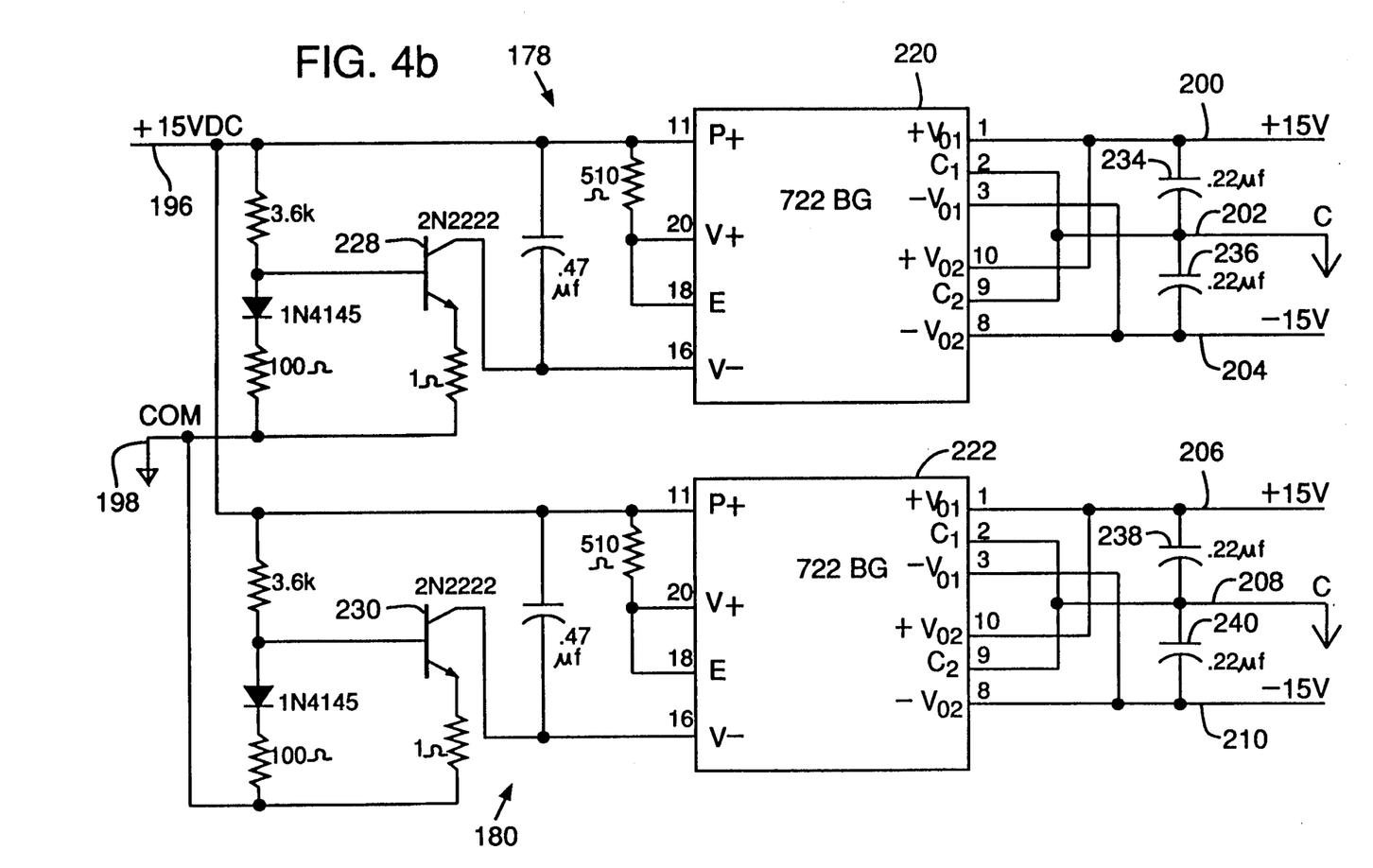
FIG. 4b shows isolated DC/DC converters that electrically isolate the current sources and sense amplifiers from the bridge.

FIG. 4b shows details of isolated DC/DC converters 178 and 180, which are shown in block form in FIG. 3. The circuitry of FIG. 4b is an alternative to batteries 186a, 186b, 188a, and 188b of FIG. 4a. Referring to FIG. 4b, the inputs and outputs to isolated DC/DC converters 178 and 180 are assigned the same reference numbers in FIG. 3 and FIGS. 4a and 4b for convenience in identification. A 15 volt direct current source and a common ground are supplied by conductors 196 and 198, respectively, to converters 178 and 180. Integrated circuits 220 and 222 are isolated DC/DC converters Model No. 722BG manufactured by Burr Brown. The pin connections and associated components are discussed in the Burr Brown Application Hint Data Sheet 722. Transistors 228 and 230 are Model 2N2222 transistors that provide short circuit protection. Capacitors 234, 236, 238, and 240 provide filtering. Converter 178 provides +15 volts on conductor 200, a common voltage on conductor 202 and −15 volts on conductor 204. Converter 180 provides +15 volts on conductor 206, a common voltage on conductor 208, and −15 volts on conductor 210. The common voltage of conductor 202 is isolated from the common voltage on conductor 208.

There are several different common voltages or grounds in the circuit 100 that are shown in FIGS. 4–7. A triangle with a line bisecting it, such as is shown with conductor 198, represents a common ground to which the computer (not shown) is connected. Bridge 110 may also be connected to the common voltage of conductor 198. An arrow pointing downward, such as is shown with conductor 208, represents a ground that is isolated from bridge 110. A triangle with a "G" in it represents a guard signal for conductors 170, 172, 174, and 176 of bridge 110.

Figures 5, 6:
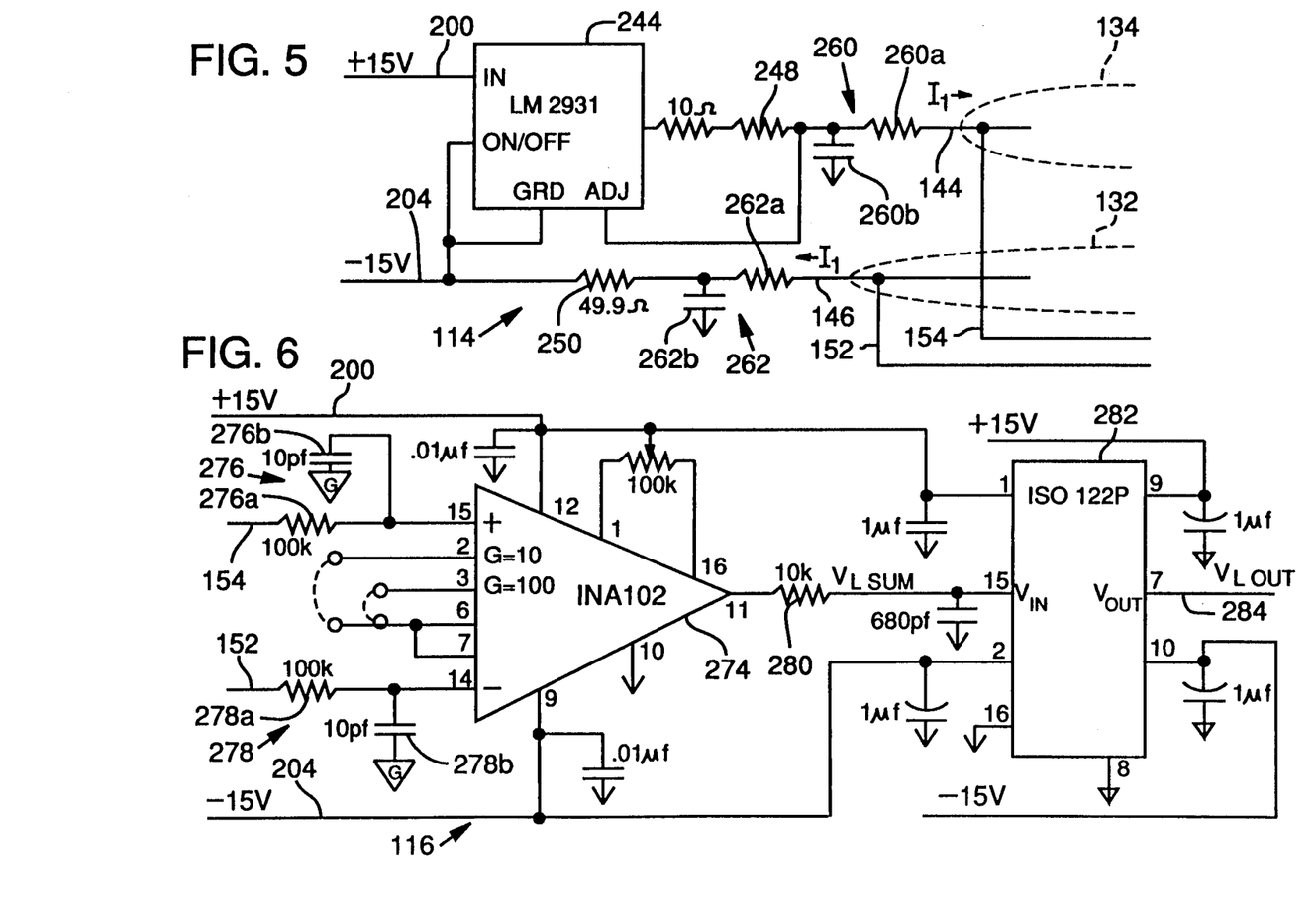
FIG. 5 shows a current source circuit used in the present invention.
FIG. 6 shows a sense amplifier circuit used in the present invention.

FIG. 5 shows current source 114 that is connected to probes 132 and 134 through conductors 146 and 144, respectively. Current source 118, shown in FIG. 3, is analogous to current source 114 shown in FIGS. 3 and 5. Referring to FIG. 5, current source 114 includes voltage regulator current source 244, which is a standard LM2931, manufactured by Motorola Semiconductor, Inc., that provides a constant current source. Resistor 248 is a calibration resistor; and resistor 250, having a resistance of, e.g., 49.9 ohms, provides system bias at zero volts. Current $I_1$ is carried on conductor 144 toward probe 134, and current $I_1$ is carried on conductor 146 away from probe 132. Conductors 154 and 152 are connected between probes 132 and 134 and to sense amplifier 116 (FIG. 3).

Low-pass filter 260 comprised of resistor 260a and capacitor 260b, which is connected is series with conductor 144, blocks current $I_2$. Low-pass filter 260 also blocks current $I_3$, if the frequency of current $I_3$ is much higher than the frequency of $I_1$, which is a direct current having a frequency of zero Hertz in the illustrated embodiment. Low-pass filter 262 comprised of resistor 262a and capacitor 262b, which is connected in series with conductor 144, blocks current $I_2$. If current $I_2$ were a direct current with a frequency of zero Hertz, then band pass filters could be used in place of filters 260 and 262.

FIG. 6 shows sense amplifier 116 which includes sense amplifier integrated circuit 274, which is a standard INA102 integrated circuit manufactured by Burr-Brown Corp. of Tucson, Arizona. The details of sense amplifier 120 are analogous to the details of sense amplifier 116, shown in FIG. 6. The inputs to pins 14 and 15 of circuit 274 are connected to conductors 154 and 152, respectively, which are shown in FIGS. 3 and 5. The inputs to pins 14 and 15 of circuit 274 have a very high input impedance. The inputs may, however, pass a limited amount of high frequency signals. For this reason, low-pass filter 276 comprised of resistor 276a and capacitor 276b and low-pass filter 278 comprised of resistor 278a and capacitor 278b are connected between pins 15 and 14, respectively, and conductors 154 and 152, respectively. Filters 260, 262, 276, and 278 can be passive, as shown, or active.

Figure 7:
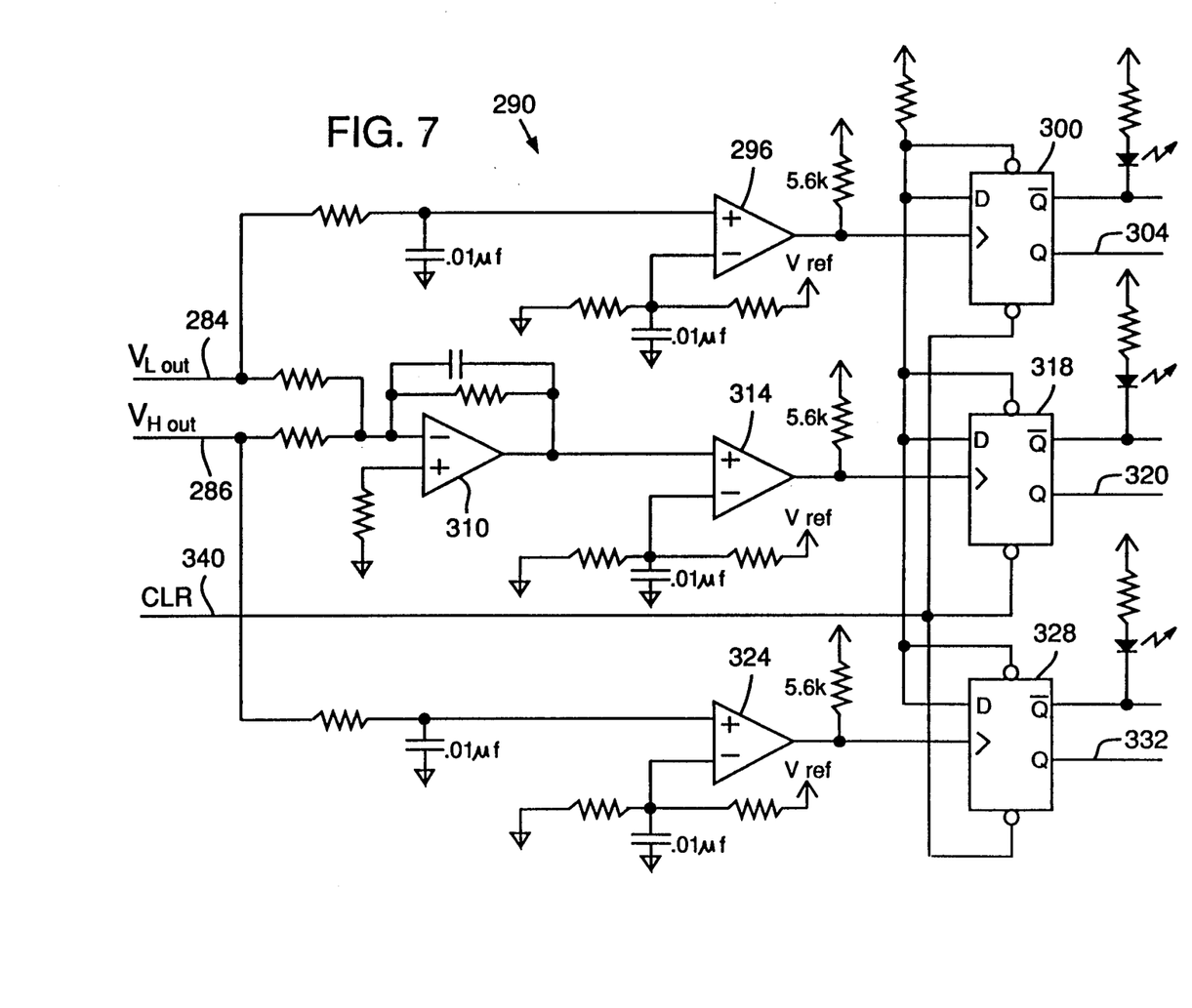
FIG. 7 shows a comparator circuit that is used in the present invention.

The output of circuit 274 on pin 11 has a voltage that is proportional to the sum of the contact resistances $R_{LSUM}$, which is equal to the contact resistances $R_{La}$ plus $R_{Lb}$. A resistor 280 is placed between pin 11 of circuit 274 and the input to pin 15 of isolation circuit 282, which is a standard ISO122P, manufactured by Burr-Brown Corp. The output of resistor 280 is a signal $V_{LSUM}$, which has a voltage that is proportional to $R_{LSUM}$. The "L" in $V_{LSUM}$ represents "low" because circuit 274 is connected to the electrically low side of DUT 104. Referring to FIG. 3, $V_{LSUM}$ and $V_{HSUM}$ are shown on conductors 284 and 286 between sense amplifier 114 and isolated interface 182, and sense amplifier 120 and isolated interface 184, respectively. Isolation circuit 282 and the circuits of FIG. 7 are contained in isolated interface 182. There is circuitry that is analogous to the circuitry in FIGS. 6 and 7 in sense amplifier 120 and isolated interface 184. The output of isolation circuit 280 is voltage $V_{Lout}$ on conductor 284, which is electrically isolated from the input of isolation circuit 260, at pin 15. The voltage $V_{Lout}$ is carried by conductor 284 to comparator circuit 290, which is shown in FIG. 7.

Referring to FIG. 7, comparator circuit 290 receives $V_{Lout}$ and $V_{Hout}$ from sense amplifiers 116 and 120, respectively. "L" stands for the electrically low side of DUT 104 and "H" stands for the electrically high side of the DUT 104. In FIG. 7, an upward pointing arrow represents a positive voltage, e.g., +5 volts. Comparator 296 compares $V_{Lout}$ with a reference voltage $V_{ref}$ to determine whether the sum of the contact resistance $R_{LSUM}$ in the electrically low side of DUT 104 exceeds a maximum. If the maximum is exceeded, then D flip-flop 300 is set and the Q output of flip-flop 300, which is connected to conductor 304 assumes a logic one state. Conductor 304 is connected to an input to the computer (not shown). The $\overline{Q}$ output of flip-flop 300 is connected to a light emitting diode ("LED") that signals to operators of system 100 that a low side contact is not good.

The voltages $V_{Lout}$ and $V_{Hout}$ are summed by summing amplifier 310 and connected to the positive input of a voltage comparator 314. If the sum of $V_{Lout}$ and $V_{Hout}$ exceeds $V_{ref}$, then D flip-flop 318 is set. The Q output of flip-flop 318 is connected to the computer through conductor 320. The $\overline{Q}$ output of flip-flop 318 is connected to an LED signal to operators of system 100 that a contact is not good.

Comparator 324 compares volta $V_{Hout}$ with $V_{ref}$. If $V_{Hout}$ exceeds the $V_{ref}$, then D flip-flop 332 is set. The Q output is connected to the computer. It is preferred that each of the reference voltages $V_{ref}$ for comparators 296, 314, and 324 is the same value. Alternatively, they could have different values.

To prevent the lead verification test from interfering with the component test, the following method is used. (1) Physical contact is made with the component. (2) The lead verification test signal is generated. (3) A time of sufficient duration expires to allow the lead verification signal to be stabilized. (4) The component test is started. (5) The component test terminates. (6) The lead verification signal is terminated. During steps (4) and (5), the lead verification circuitry monitors the resistances present in each loop. If at any time during the component test, the resistance exceeds a maximum value which would compromise the component test the component test result would be ignored and a new component test could be started.

It will be obvious to those having skill in the art that many changes may be made in the above-described details of the preferred embodiment of the present invention without departing from the underlying principles thereof. The scope of the present invention should be determined, therefore, only by the following claims.

We claim:

1. A system for concurrent testing and lead verification of an electronic component, the system comprising:
   first and second electrical probes;
   contact resistance determining means electrically connected to the first and second probes for determining a sum of amounts of contact resistances between the first probe and a lead of the component and between the second probe and the lead of the component, the contact resistance determining means including first current driving means for producing a current $I_1$ that propagates through the first probe, the lead of the component, and the second probe; and
   component testing means for determining a value of a parameter of the component while the contact resistance means determines the sum of the amounts of contact resistances, the component testing means being electrically connected to the first and second probes, and the component testing means including second current driving means for producing a current $I_2$ that propagates through the component, the currents $I_1$ and $I_2$ having frequencies, and the frequency of $I_1$ being substantially different from the frequency of $I_2$, the component testing means including a first frequency blocking means for blocking current $I_1$ and the contact resistance determining means including a second frequency blocking means for blocking current $I_2$.

2. The system of claim 1 in which the current $I_1$ is a direct current of zero frequency.

3. The system of claim 1 in which the frequency of current $I_1$ is much higher than the frequency of current $I_2$.

4. The system of claim 1 in which the frequency of current $I_2$ is much higher than the frequency of current $I_1$.

5. The system of claim 1 further comprising an isolated direct current to direct current converting means for electrically isolating the contact resistance determining means from the component testing means.

6. The system of claim 1 in which the contact resistance determining means includes sense amplification means for determining a difference between a voltage of the first probe and a voltage of the second probe.

7. The system of claim 1 in which the component testing means includes a conventional bridge.

8. The system of claim 1 in which the parameter is capacitance and the component is a capacitor.

9. The system of claim 1 in which the lead is a first lead and the component includes a second lead and the component testing means includes means for determining a difference between a voltage of the first lead and a voltage of the second lead of the component.

10. The system of claim 1 in which the component testing means is contained in a container and the first frequency blocking means is contained within the container.

11. The system of claim 1 in which the component testing means is contained in a container and the first frequency blocking means is located outside the container.

12. A system for concurrent testing and lead verification of an electronic component, the system comprising:
   first and second electrical probes;
   contact resistance determining means for determining a sum of amounts of contact resistances between the first probe and a lead of the component and between the second probe and the lead of the component, the contact resistance determining means being electrically connected to the first and second probes; and component testing means for determining a value of a parameter of the component while the contact resistance determining means is determining the amount of contact resistance between the first probe and the lead of the component and between the second probe and the lead of the component, the component testing means being electrically connected to the first and second probes, and the contact resistance determining means and the component testing means being electrically isolated from one another.

13. The system of claim 12, further comprising third and fourth probes that are electrically connected to the contact resistance determining means and to the component testing means, and wherein the lead of the component is a first lead and the sum of the amounts of contact resistances is a first sum, and the contact resistance determining means determines a second sum of amounts of contact resistances between the third probe and a second lead of the component and between the fourth probe and the second lead of the component.

14. The system of claim 13 further comprising comparison means for determining whether the first sum exceeds a first limit, the second sum exceeds a second limit, and a sum of the first and second sums exceeds a third limit.

15. The system of claim 14 in which the first limit equals the second limit, and first limit equals the third limit.

16. The system of claim 12 in which the contact resistance determining means includes a first current driving means for producing a current $I_1$ that propagates through the first probe, the lead of the component, and the second probe, and the component testing means including second current driving means for producing a current $I_2$ that propagates through the component, and the currents $I_1$ and $I_2$ having frequencies, the frequency of $I_1$ being substantially different from the frequency of $I_2$, the contact resistance determining means including a second frequency blocking means for blocking current $I_2$, the component testing means including a first frequency blocking means for blocking current $I_1$.

17. The system of claim 12 further comprising an isolated direct current to direct current converting means for electrically isolating the contact resistance determining means from the component testing means.

18. The system of claim 12 in which the contact resistance determining means includes sense amplification means for determining a difference between a voltage of the first probe and a voltage of the second probe.

19. The system of claim 12 in which the lead is a first lead and the component includes a second lead and the component testing means includes sense amplification means for determining a difference between a voltage of the first lead and a voltage of the second lead of the component.

20. A method for concurrently testing and performing lead verification of an electric component having a lead, the method comprising the steps of:

pacing first and second electrical probes in physical contact with the lead of the component;

producing a current and passing the current through the first probe, the lead of the component, and the second probe;

measuring a difference between voltages of the first and second probes to determine whether the difference exceeds a predetermined amount; and measuring a parameter of the component while the difference between voltages is being measured.

21. A system for concurrent testing and lead verification of an electronic component, the system comprising:

first and second electrical probes;

contact resistance determining means electrically connected to the first and second probes for determining a sum of amounts of contact resistances between the first probe and a lead of the component and between the second probe and the lead of he component, the contact resistance determining means including first current driving means for producing a current $I_1$ that passes through the first probe, the lead of the component, and the second probe;

component testing means electrically connected to the first and second probes for determining a value of a parameter of the component while the contact resistance determining mean determines the sum of the amounts of contact resistances, the component testing means including second current driving means for producing a current $I_2$ that passes through the component, the currents $I_1$ and $I_2$ having frequencies such that the frequency of the current $I_1$ is substantially different from the frequency of the current $I_2$; and first frequency blocking means for blocking the current $I_1$ from entering the component testing means and second frequency blocking means included in the contact resistance determining means for blocking the current $I_2$ from entering the contact resistance determining means.

22. The system of claim 21 in which the component testing means is contained in a container and the first frequency blocking means is located outside the container.

* * * * *

UNITED STATES PATENT AND TRADEMARK OFFICE
CERTIFICATE OF CORRECTION

PATENT NO. : 5,057,772

DATED : October 15, 1991

INVENTOR(S) : David A. Bruno, et al

It is certified that error appears in the above-identified patent and that said Letters Patent is hereby corrected as shown below:

Column 2, line 34, change "contract" to --contact--.

Column 3, line 18, change "$R_{ls}$" to --$R_{la}$--.

Column 4, line 45, after "1MHz" insert --.--.

Column 4, line 50, change "a frequencies" to --frequencies--.

Column 4, line 63, change "splice" to --source--.

Column 5, line 24, change "leads-" to --leads--.

Column 5, line 26, change "sources 114-" to --sources 114--.

Column 6, line 28, change "$I_1$is" to --$I_1$ is--.

Column 7, line 43, change "D flip-flop 332" to --D flip-flop 328--.

UNITED STATES PATENT AND TRADEMARK OFFICE
CERTIFICATE OF CORRECTION

PATENT NO. : 5,057,772

DATED : October 15, 1991

INVENTOR(S) : David A. Bruno, et al

It is certified that error appears in the above-identified patent and that said Letters Patent is hereby corrected as shown below:

Column 10, line 10, change "pacing first" to --placing first--.

Column 10, line 28, change "he component" to --the component--.

Signed and Sealed this

Twenty-seventh Day of April, 1993

Attest:

MICHAEL K. KIRK

*Attesting Officer*       *Acting Commissioner of Patents and Trademarks*